United States Patent
Kagawa et al.

(10) Patent No.: US 12,506,012 B2
(45) Date of Patent: Dec. 23, 2025

(54) SUBSTRATE PROCESSING METHOD AND SUBSTRATE PROCESSING APPARATUS

(71) Applicant: Tokyo Electron Limited, Tokyo (JP)

(72) Inventors: Koji Kagawa, Kumamoto (JP); Koukichi Hiroshiro, Kumamoto (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 433 days.

(21) Appl. No.: 18/248,900

(22) PCT Filed: Oct. 6, 2021

(86) PCT No.: PCT/JP2021/036957
§ 371 (c)(1),
(2) Date: Apr. 13, 2023

(87) PCT Pub. No.: WO2022/085449
PCT Pub. Date: Apr. 28, 2022

(65) Prior Publication Data
US 2023/0386855 A1    Nov. 30, 2023

(30) Foreign Application Priority Data
Oct. 19, 2020   (JP) ................. 2020-175438

(51) Int. Cl.
*H01L 21/32*       (2006.01)
*H01L 21/02*       (2006.01)
(Continued)

(52) U.S. Cl.
CPC .......... *H01L 21/32* (2013.01); *H01L 21/0234* (2013.01); *H01L 21/0332* (2013.01);
(Continued)

(58) Field of Classification Search
CPC . H01L 21/32; H01L 21/0234; H01L 21/0332; H01L 21/30604; H01L 21/31111;
(Continued)

(56) References Cited

U.S. PATENT DOCUMENTS

2009/0170314 A1\*  7/2009  Morinaga ........... H01L 21/3105
                                                                438/763
2010/0173494 A1\*  7/2010  Kobrin ................ H01L 21/0337
                                                                156/345.1
(Continued)

FOREIGN PATENT DOCUMENTS

JP        2009-164198 A       7/2009
JP        2013-105909 A       5/2013
(Continued)

OTHER PUBLICATIONS

International Search Report for PCT/JP2021/036957 dated Nov. 16, 2021.

*Primary Examiner* — Ratisha Mehta
*Assistant Examiner* — Sophia W Kao
(74) *Attorney, Agent, or Firm* — Chrisman Gallo Tochtrop LLC

(57) ABSTRACT

A substrate processing method includes (A) to (C) described below. (A) A substrate having a surface in which a SiO film and a Low-k film or a SiN film are exposed is preprared. The Low-k film or the SiN film is exposed to oxygen plasma. (B) A protective film is formed on the Low-k film or the SiN film by supplying an organic compound (self-assembled monolayer (SAM) material) configured to form a SAM to the surface of the substrate. (C) The SiO film is etched by supplying hydrofluoric acid to the surface of the substrate while inhibiting etching of the Low-k film or the SiN film caused by the hydrofluoric acid with the protective film.

17 Claims, 10 Drawing Sheets

(51) Int. Cl.
*H01L 21/033* (2006.01)
*H01L 21/306* (2006.01)
*H01L 21/311* (2006.01)
*H01L 21/67* (2006.01)

(52) U.S. Cl.
CPC .. *H01L 21/30604* (2013.01); *H01L 21/31111* (2013.01); *H01L 21/6708* (2013.01); *H01L 21/6715* (2013.01)

(58) Field of Classification Search
CPC ............. H01L 21/6708; H01L 21/6715; H01L 21/3105; H01L 21/31144; H01L 21/306; H01L 21/31116; H01L 21/67069
See application file for complete search history.

(56) References Cited

U.S. PATENT DOCUMENTS

2012/0329269 A1* 12/2012 Arnold .............. H01L 21/02304
438/643
2013/0122706 A1* 5/2013 Okuchi ............ H01L 21/30604
438/694

FOREIGN PATENT DOCUMENTS

| JP | 2014-516477 A | 7/2014 | | |
|---|---|---|---|---|
| WO | 2012/148641 A2 | 11/2012 | | |
| WO | WO-2014077199 A1 * | 5/2014 | ........ | H01L 21/31111 |

\* cited by examiner

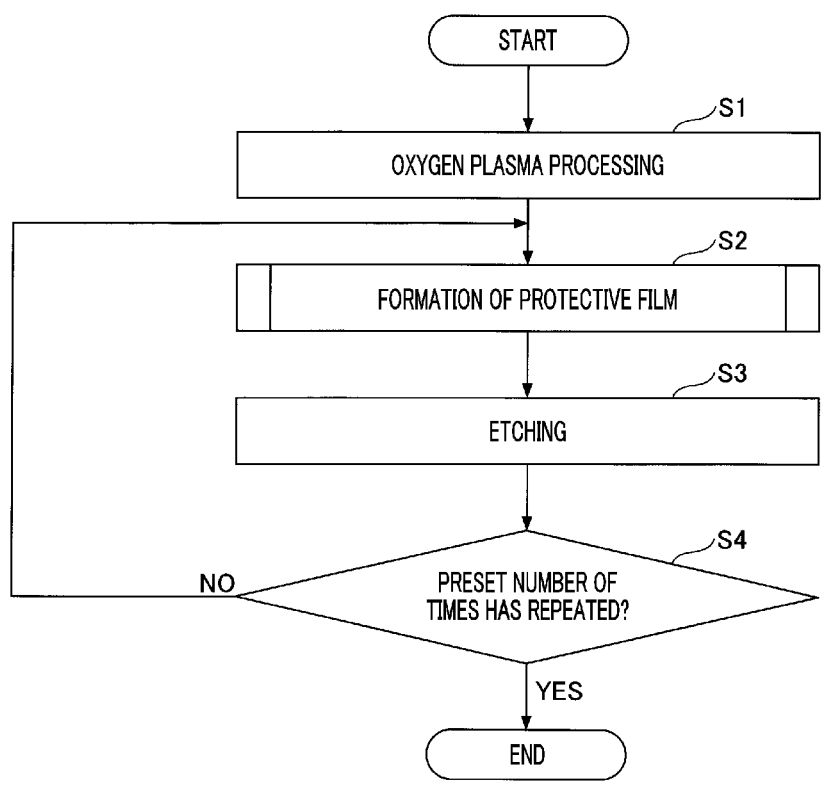

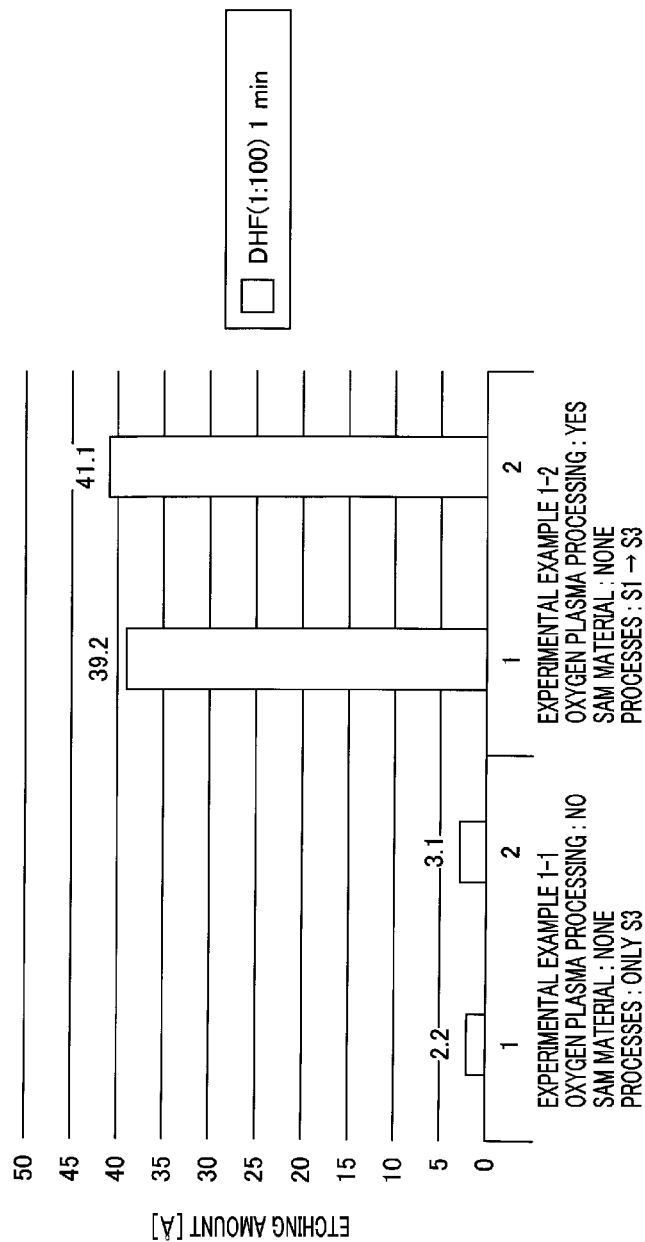

SUBSTRATE PROCESSING METHOD AND SUBSTRATE PROCESSING APPARATUS

CROSS-REFERENCE TO RELATED APPLICATIONS

This Application is a U.S. national phase application under 35 U.S.C. § 371 of PCT Application No. PCT/JP2021/036957 filed on Oct. 6, 2021, which claims the benefit of Japanese Patent Application No. 2020-175438 filed on Oct. 19, 2020, the entire disclosures of which are incorporated herein by reference.

TECHNICAL FIELD

The various aspects and embodiments described herein pertain generally to a substrate processing method and a substrate processing apparatus.

BACKGROUND

A method described in Patent Document 1 includes vaporizing a silylated compound to form a flow of the vaporized silylated compound, and exposing a dielectric film damaged by the flow.

Patent Document 1: Published Japanese Translation of PCT Patent Application No. 2014-516477

SUMMARY

In an exemplary embodiment, a substrate processing method includes (A) to (C) described below. (A) A substrate having a surface in which a SiO film and a Low-k film or a SiN film are exposed is preprared. The Low-k film or the SiN film is exposed to oxygen plasma. (B) A protective film is formed on the Low-k film or the SiN film by supplying an organic compound (self-assembled monolayer (SAM) material) configured to form a SAM to the surface of the substrate. (C) The SiO film is etched by supplying hydrofluoric acid to the surface of the substrate while inhibiting etching of the Low-k film or the SiN film caused by the hydrofluoric acid with the protective film.

BRIEF DESCRIPTION OF THE DRAWINGS

FIG. 2 is a flowchart illustrating a substrate processing method according to the exemplary embodiment.

FIG. 5 is a diagram illustrating results of Experimental Examples 1-1 and 1-2.

DETAILED DESCRIPTION

Figure 1:
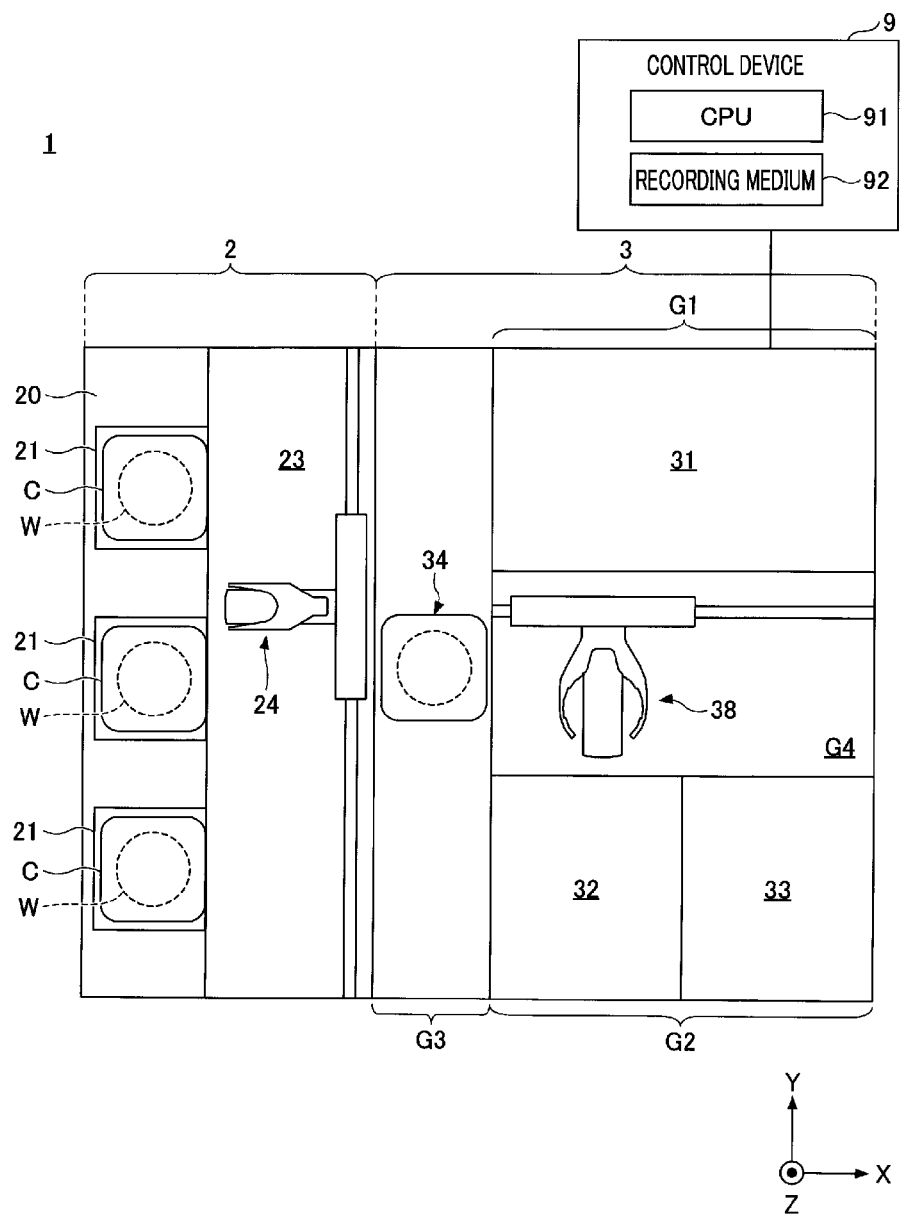
FIG. 1 is a plan view illustrating a substrate processing apparatus according to an exemplary embodiment.

Hereinafter, exemplary embodiments of the present disclosure will be described with reference to the accompanying drawings. Further, in the various drawings, same or corresponding parts will be assigned same reference numerals, and redundant description will sometimes be omitted. In the present specification, the X-axis direction, the Y-axis direction and the Z-axis direction are orthogonal to each other. The X-axis and Y-axis directions are horizontal directions, and the Z-axis direction is a vertical direction.

First, referring to FIG. 1, a substrate processing apparatus 1 according to an exemplary embodiment will be described. As shown in FIG. 1, the substrate processing apparatus 1 is equipped with a carry-in/out station 2, a processing station 3, and a control device 9. The carry-in/out station 2 and the processing station 3 are arranged in this order in the positive X-axis direction.

The carry-in/out station 2 includes a placing table 20 and a transfer section 23. The placing table 20 is equipped with a plurality of (e.g., three) placing plates 21. The plurality of placing plates 21 are arranged in a row in the Y-axis direction. Respectively provided on these placing plates 21 are cassettes C. Each of the cassettes C accommodates therein a multiple number of substrates W horizontally at a certain distance therebetween in a vertical direction. Here, the number of the placing plates 21 and the number of the cassettes C are not particularly limited.

The transfer section 23 is provided adjacent to the positive X-axis side of the placing table 20 and the negative X-axis side of the processing station 3. The transfer section 23 is equipped with a transfer device 24 configured to hold the substrate W. The transfer device 24 is configured to be movable in horizontal directions (both in the X-axis direction and the Y-axis direction), movable in a vertical direction, and pivotable around a vertical axis. The transfer device 24 serves to transfer the substrates W between the cassettes C on the placing table 20 and a third processing block G3 of the processing station 3.

The processing station 3 is equipped with, by way of example, a first processing block G1, a second processing block G2, and the third processing block G3. Further, a transfer block G4 is provided in a region surrounded by the first processing block G1, the second processing block G2, and the third processing block G3.

The transfer block G4 is equipped with a transfer device 38 configured to hold the substrate W. The transfer device 38 is configured to be movable in horizontal directions (both in the X-axis direction and the Y-axis direction), movable in a vertical direction, and pivotable around a vertical axis. This transfer device 38 transfers the substrate W between the first processing block G1, the second processing block G2, and the third processing block G3.

The first processing block G1 is disposed adjacent to the positive Y-axis side of the transfer block G4. The first processing block G1 includes, for example, a plasma processing apparatus 31. The plasma processing apparatus 31 is configured to process a surface of the substrate W with oxygen plasma.

The second processing block G2 is disposed adjacent to the negative Y-axis side of the transfer block G4. The second processing block G2 includes, for example, a protective film forming apparatus 32 and an etching apparatus 33. The protective film forming apparatus 32 is configured to supply an organic compound (self-assembled monolayer (SAM) material) for forming a SAM to the surface of the substrate W. The etching apparatus 33 is configured to supply hydrofluoric acid (HF) to the surface of the substrate W.

The third processing block G3 is disposed adjacent to the negative X-axis side of the transfer block G4. The third processing block G3 has, for example, a transition device 34. The transition device 34 transfers the substrate W between the transfer device 24 of the carry-in/out station 2 and the transfer device 38 of the processing station 3.

Further, the processing station 3 may not have the plasma processing apparatus 31. In this case, the substrate W is carried into the substrate processing apparatus 1 while being accommodated in the cassette C after being processed with the oxygen plasma in advance. The type, the layout and the number of devices constituting the processing station 3 may not be limited to the example shown in FIG. 1.

The control device 9 is, for example, a computer, and includes a CPU (Central Processing Unit) 91 and a recording medium 92 such as a memory. The recording medium 92 stores therein a program for controlling various processings performed in the substrate processing apparatus 1. The control device 9 controls an operation of the substrate processing apparatus 1 by causing the CPU 91 to execute the program stored in the recording medium 92.

Now, referring to FIG. 2 to FIG. 4B, a substrate processing method according to the present exemplary embodiment will be described. As shown in FIG. 2, the substrate processing method includes, for example, processes S1 to S4. These processes S1 to S4 are performed under the control of the control device 9. The substrate processing method needs to include the processes S2 and S3 at least.

First, the transfer device 24 of the carry-in/out station 2 takes out the substrate W from the cassette C on the placing table 20, and transfers it to the transition device 34. Subsequently, the transfer device 38 of the processing station 3 receives the substrate W from the transition device 34, and transfers it to the plasma processing apparatus 31.

Figure 3A:
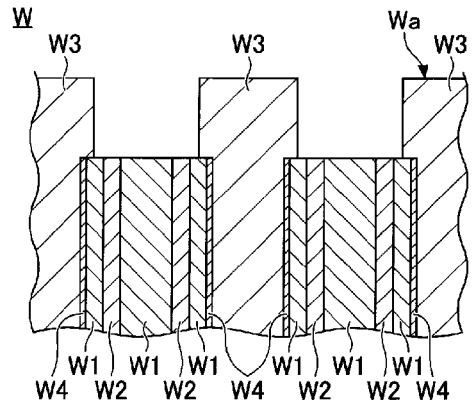
FIG. 3A is a cross sectional view illustrating an example of a substrate in a process S1 of FIG. 2.

Next, the plasma processing apparatus 31 processes the surface of the substrate W with the oxygen plasma (process S1). As a result, the substrate W as shown in FIG. 3A, for example, is prepared. The substrate W has a surface (substrate surface) Wa in which a SiN film W1 and a SiO film W2 are exposed. The SiN film W1 and the SiO film W2 are adjacent to each other in the surface Wa, but they may be spaced apart from each other.

Both the SiN film W1 and the SiO film W2 are exposed to the oxygen plasma before the process S2. However, the technique of the present disclosure is not limited thereto. At least the SiN film W1 needs to be exposed to the oxygen plasma before the process S2, and the SiN film W1 may be exposed to the oxygen plasma before the formation of the SiO film W2.

Here, the SiN film refers to a film containing silicon (Si) and nitrogen (N). The atomic ratio of Si and N in the SiN film is not limited to 1:1. The same goes for the SiO film, a SiOC film, a SiOCH film, a TiN film, and a TaN film.

The substrate W may have a Low-k film instead of the SiN film W1. The Low-k film is a film having a lower dielectric constant than the SiO film. Although not particularly limited, the Low-k film may include, by way of non-limiting example, a SiOC film, a SiOCH film, a HSQ (hydrogen silsesquioxane) film, a MSQ (methyl silsesquioxane) film, or a PAE (polyaryl ether) film.

The substrate W includes a non-illustrated base substrate on which the SiN film W1, the SiO film W2, and so forth are formed. The base substrate is a silicon wafer or a compound semiconductor wafer. Although not particularly limited, the compound semiconductor wafer may be, by way example, but not limitation, a GaAs wafer, a SiC wafer, a GaN wafer, or an InP wafer. The base substrate may be a glass substrate.

The substrate W may have an additional film other than the SiN film W1 and the SiO film W2. For example, the substrate W may have a metal film W3, and, also, may have a barrier film W4 configured to suppress metal diffusion from the metal film W3 into the SiN film W1. The metal film W3 is, by way of example, a W (tungsten) film, and the barrier film W4 is, for example, a TiN film. The barrier film W4 is not limited to the TiN film, and it may be, for example, a TaN film. Furthermore, the metal film W3 is not limited to the W film, and it may be, by way of example, a Cu (copper) film, a Co (cobalt) film, or a Ru (ruthenium) film.

The process S1 is performed in, for example, patterning the metal film W3. By way of example, after etching a part of the metal film W3 while protecting the rest of the metal film W3 by using a mask, the mask is ached with the oxygen plasma. During the aching, the SiN film W1 is exposed to the oxygen plasma.

Further, the timing when the SiN film W1 is exposed to the oxygen plasma needs to be before the supply of the SAM material to the SiN film W1, for example, before the formation of the barrier film W4 and the metal film W3.

After the above-described process S1, the transfer device 38 takes out the substrate W from the plasma processing apparatus 31, and transfers it to the protective film forming apparatus 32.

Figure 3B:
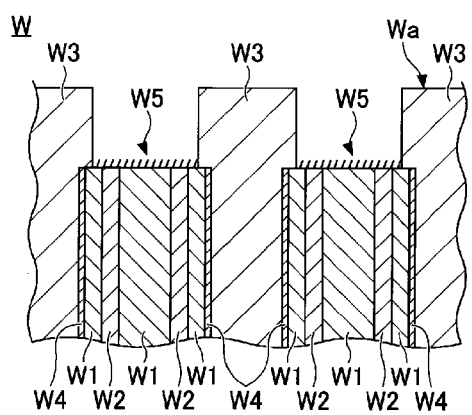
FIG. 3B is a cross sectional view illustrating an example of the substrate in a process S2 of FIG. 2.

Next, the protective film forming apparatus 32 is configured to supply the SAM material to the substrate surface Wa to form a protective film W5 on the SiN film W1 as shown in FIG. 3B (process S2). The SAM material may be supplied as a solution by being dissolved in a solvent, or supplied as a gas. The gas is obtained by heating the solution, for example. Alternatively, the gas may be obtained by bubbling the solution with a carrier gas. By diluting the SAM material with the solvent, the consumption amount of the SAM material can be reduced. A concentration of the SAM material in the solution is, for example, 1 volume percentage (vol %) to 20 vol %.

Although not particularly limited, the SAM material may be, by way of non-limiting example, (trimethyl silyl)dimethyl amine (N, N-Dimethyltrimethylsilylamine: TMSDMA), butyldimethylsilane (Butyl-DS), octadecyldimethylsilane (Octadecyl-DS), triethylsilane, or octadecyldiisobutylsilane.

The SAM material tends to be easily chemically adsorbed to a surface having an OH group. The OH group tends to be easily formed on a surface of an oxide film.

The SiN film W1 is exposed to the oxygen plasma in advance, and, at that time, an OH group is formed on the surface of the SiN film W1. Accordingly, the SAM material is chemically adsorbed to the SiN film W1, and the protective film W5 as SAM is formed on the surface of the SiN film W1. The protective film W5 is also formed on the surface of the SiO film W2.

Upon the completion of the process S2, the transfer device 38 takes out the substrate W from the protective film forming apparatus 32, and transfers it to the etching apparatus 33.

Figure 3C:
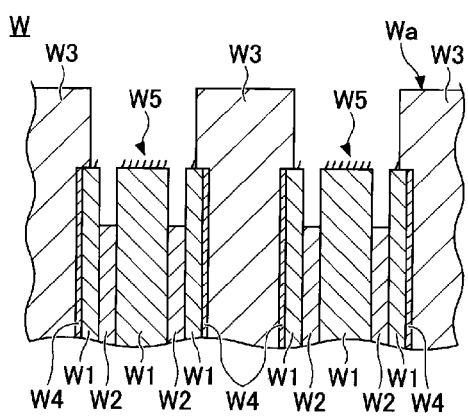
FIG. 3C is a cross sectional view illustrating an example of the substrate in a process S3 of FIG. 2.

Then, the etching apparatus 33 is configured to supply hydrofluoric acid (HF) to the substrate surface Wa to etch the SiO film W2 as shown in FIG. 3C (process S3). The hydrofluoric acid may be supplied as a solution by being dissolved in a solvent, or supplied as a gas. The gas is obtained by heating the solution, for example. Alternatively, the gas may be obtained by bubbling the solution with a carrier gas.

The etching apparatus 33 etches the SiO film W2, while inhibiting etching of the SiN film W1 by the hydrofluoric acid with the protective film W5. The etching rate of the SiN film W1 can be slowed down by the protective film W5, so that the SiO film W2 can be selectively etched.

As stated above, in the process S1, the substrate surface Wa is processed with the oxygen plasma. The oxygen plasma speeds up the etching rate of the SiN film W1 by the hydrofluoric acid. Meanwhile, in the process S2, the protective film W5 is formed. The protective film W5 slows down the etching rate of the SiN film W1 by the hydrofluoric acid. The protective film W5 may be capable of reducing the etching rate of the SiN film W1 to the extent that it becomes lower than an etching rate obtained before the oxygen plasma processing (process S1).

Further, although the protective film W5 is formed on the SiO film W2 as well, the etching rate of the SiO film W2 is sufficiently high. The SiO film W2 has an etching rate higher than that of the SiN film W1 even before the oxygen plasma processing (process S1). Since the protective film W5 is the SAM, there is a gap between single molecules. If there exists such a gap, a surface layer of the SiO film W2, which supports the SAM, is removed because the etching rate of the SiO film W2 is high. Thus, the SAM is removed by lift-off. As a result, the etching of the SiO film W2 proceeds at the same rate as in the case where no SAM exists.

Figure 4A:
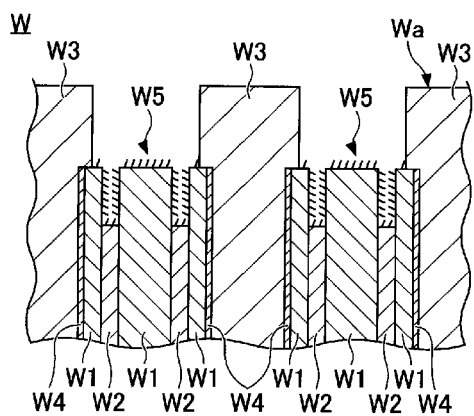
FIG. 4A is a cross sectional view showing an example of the substrate in the process S2 performed the second time.
Figure 4B:
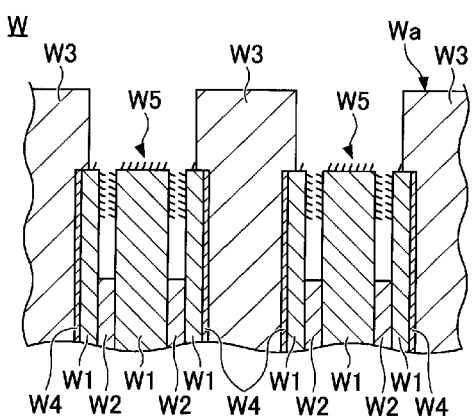
FIG. 4B is a cross sectional view showing an example of the substrate in the process S3 performed the second time.

After the above-described process S3, the control device 9 checks whether the processes S2 and S3 have been repeated a preset number of times (process S4). If the repetition number does not reach the preset number of times (process S4, NO), the etching amount of the SiO film W2 may not reach a target value. Thus, as shown in FIG. 4A and FIG. 4B, the processes S2 and S3 are performed again.

Meanwhile, if the repetition number has reached the preset number of times (process S4, YES), the etching amount of the SiO film W2 may reach the target value. Therefore, the transfer device 38 takes out the substrate W from the etching apparatus 33 and transfers it to the transition device 34. Then, the transfer device 24 of the carry-in/out station 2 takes out the substrate W from the transition device 34, and accommodates the substrate W in the cassette C on the placing table 20. Thereafter, the control device 9 ends the current processing.

Although the repetition number of the processes S2 and S3 may be one time, it is desirable that they are repeated multiple times. This is because the protective film W5 is gradually etched by the hydrofluoric acid to gradually disappears. By repeating the processes S2 and S3, the protective film W5 can be replenished along the way (see FIG. 4A), so that the etching amount of the SiO film W2 can be increased while inhibiting the etching of the SiN film W1.

In the present exemplary embodiment, the protective film forming apparatus 32 and the etching apparatus 33 are provided. However, a liquid processing apparatus serving as both of them may be provided instead. The liquid processing apparatus is configured in the same manner as the protective film forming apparatus 32 shown in FIG. 9, and supplies a liquid containing the SAM material and a liquid containing the hydrofluoric acid to the substrate surface Wa.

Now, referring to FIG. 5, results of Experimental Examples 1-1 and 1-2 will be described. In Experimental Examples 1-1 and 1-2, one containing a silicon wafer and a SiOC film is prepared as the substrate W. The SiOC film is formed on the silicon wafer by a CVD (Chemical Vapor Deposition) method.

In Experimental Example 1-1, only the process S3 is performed without carrying out the processes S1 and S2. In process S3, the SiOC film is etched by using dilute hydrofluoric acid (DHF), and an etching amount thereof is measured. As for the DHF, a ratio (volume ratio) of HF:$H_2O$ is set to be 1:100. The DHF is supplied as a liquid. An etching time is set to be 1 minute. Processing results of two sheets of substrates are shown in FIG. 5.

Meanwhile, in Experimental Example 1-2, after the process S1 is performed, the process S3 is performed without performing the process S2. Processing conditions for the process S3 are the same as described in Experimental Example 1-1. In process S1, the SiOC film is exposed to oxygen plasma. Processing conditions therefor are as follows.

Flow rate of $O_2$ gas: 800 sccm
Frequency of power for plasma formation: 13.56 MHz
Power for plasma formation: 2500 W
Processing time: 120 seconds As can be clearly seen from the comparison of the result of Experimental Example 1-1 shown in FIG. 5 and the result of Experimental Example 1-2 also shown in FIG. 5, if the oxygen plasma processing (process S1) is performed before the etching (process S3), the etching rate of the SiOC film increases.

Now, referring to FIG. 6, results of Experimental Examples 2-1 and 2-2 will be described. In Experimental Examples 2-1 and 2-2, one containing a silicon wafer and a SiOC film is prepared as the substrate W, the same as in Experimental Example 1-1 and the like. In Experimental Examples 2-1 and 2-2, however, TMSDMA is prepared as a SAM material in order to form the protective film W5, unlike in Experimental Example 1-1 and the like.

In Experimental Example 2-1, formation of a protective film (process S2), oxygen plasma processing (process S1), and etching (process S3) are performed in this order. The TMSDMA is supplied in an undiluted state (having a TMSDMA content of 100 vol %) by spin coating. Processing conditions for the process S1 and processing conditions for the process S3 are the same as those in Experimental Example 1-2. As for a processing time of the etching, however, two cases of 1 minute and 2 minutes are prepared.

Figure 6:
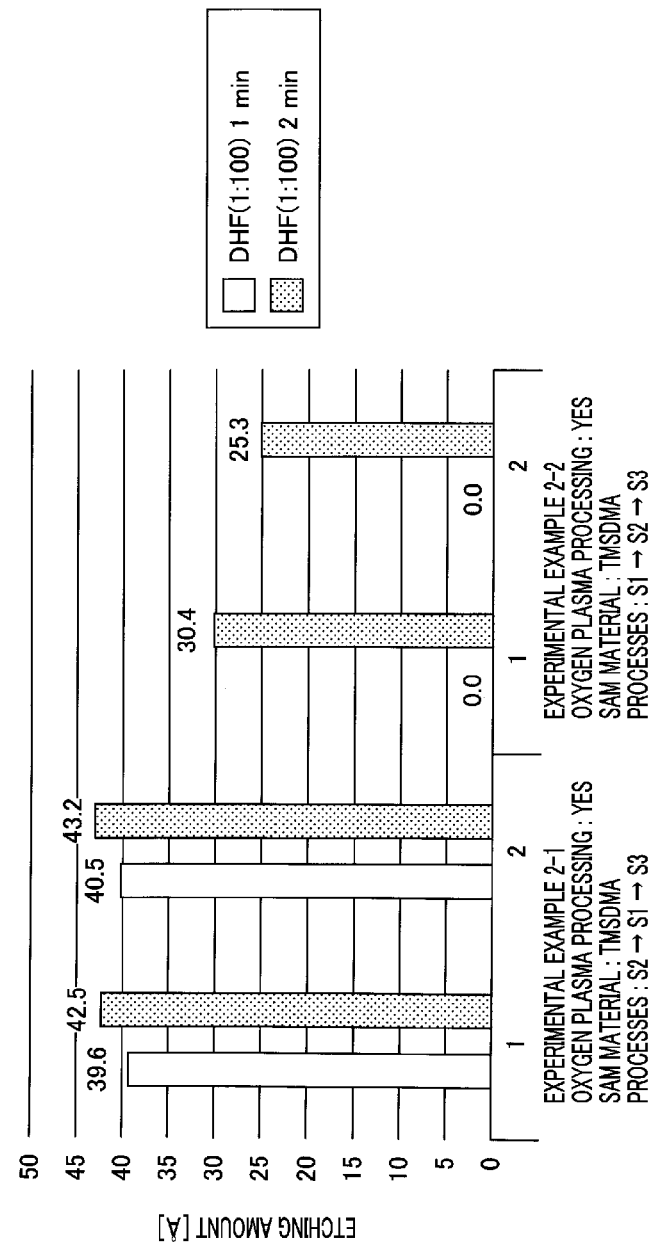
FIG. 6 is a diagram illustrating results of Experimental Examples 2-1 and 2-2.

As can be clearly seen from the comparison of the result of Experimental Example 2-1 shown in FIG. 6 with the result of Experimental Example 1-2 shown in FIG. 5, even if the process S2 is performed before the process S1, the etching rate of the SiOC film in the process S3 cannot be slowed down. This is deemed to be because the protective film is decomposed by the oxygen plasma processing. Further, in Experimental Example 2-1 shown in FIG. 6, there is almost no difference in the etching amount between the two cases where the processing time is set to be 1 minute and where the processing time is set to be 2 minutes because an increase of the etching rate by the oxygen plasma is limited to occurring only near a surface.

Meanwhile, in Experimental Example 2-2, the substrate is processed under the same processing conditions as in Experimental Example 2-1 except that the order of the supply of the SAM material (process S2) and the oxygen plasma processing (process S1) is reversed.

As can be clearly seen from the comparison of the result of Experimental Example 2-2 shown in FIG. 6 with the result of Experimental Example 2-1 also shown in FIG. 6, if the process S2 is performed after the process S1, the etching rate of the SiOC film in the process S3 can be slowed down. In particular, when the processing time of the etching is about 1 minute, the SiOC film is hardly etched.

Now, referring to FIG. 7, results of Experimental Examples 3-1 and 3-2 will be described. In Experimental Examples 3-1 and 3-2, one containing a silicon wafer and a SiOC film is prepared as the substrate W, the same as in Experimental Example 1-1 and the like. In Experimental Examples 3-1 and 3-2, however, Butyl-DS is prepared as a SAM material in order to form the protective film W5, unlike in Experimental Example 1-1 and the like.

In Experimental Example 3-1, formation of a protective film (process S2), oxygen plasma processing (process S1), and etching (process S3) are performed in this order. The Butyl-DS is supplied in an undiluted state (having a Butyl-DS content of 100 vol %) by spin coating. Processing conditions for the process S1 and processing conditions for the process S3 are the same as those in Experimental Example 1-2. As for processing time of the etching, however, two cases of 1 minute and 2 minutes are prepared.

Figure 7:
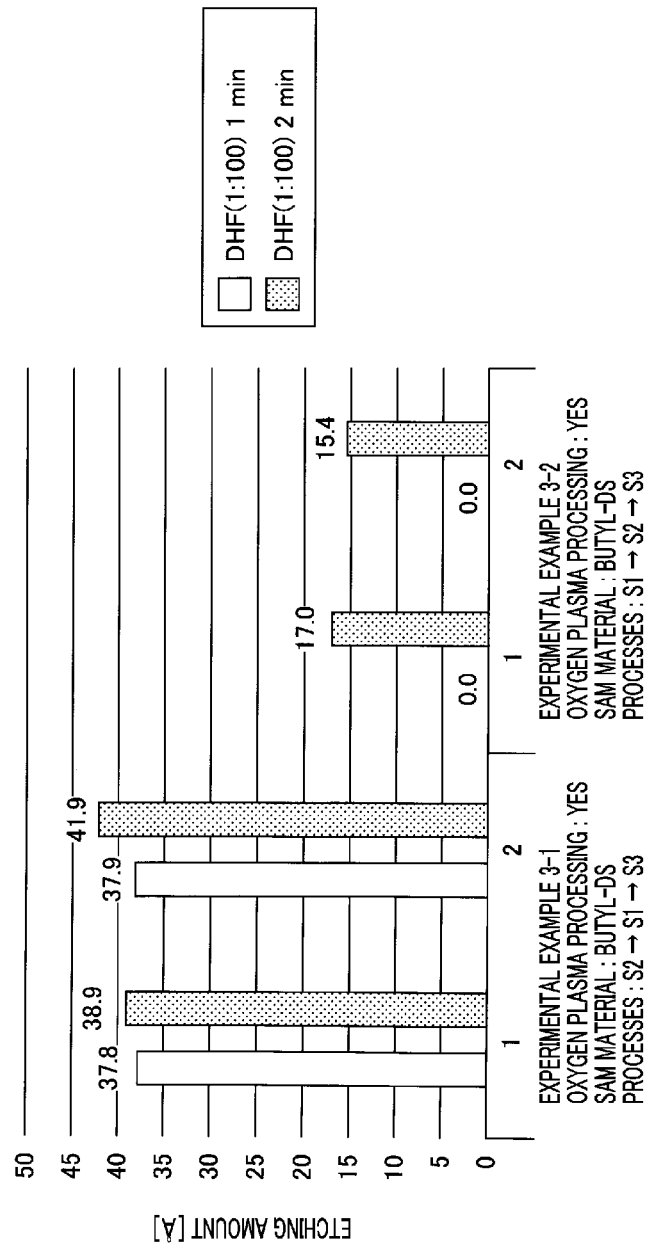
FIG. 7 is a diagram illustrating results of Experimental Examples 3-1 and 3-2.

As clearly seen from the comparison of the result of Experimental Example 3-1 shown in FIG. 7 with the result of Experimental Example 1-2 shown in FIG. 5, even if the process S2 is performed before the process S1, the etching rate of the SiOC film in the process S3 cannot be slowed down. This is deemed to be because the protective film is decomposed by the oxygen plasma processing.

Meanwhile, in Experimental Example 3-2, the substrate is processed under the same processing conditions as in Experimental Example 3-1 except that the order of the supply of the SAM material (process S2) and the oxygen plasma processing (process S1) is reversed.

As is apparent from the comparison of the result of Experimental Example 3-2 shown in FIG. 7 with the result of Experimental Example 3-1 also shown in FIG. 7, if the process S2 is performed after the process S1, the etching rate of the SiOC film in the process S3 can be slowed down. In particular, when the processing time of the etching is about 1 minute, the SiOC film is hardly etched.

Now, referring to FIG. 8, results of Experimental Examples 4-1 and 4-2 will be described. In Experimental Examples 4-1 and 4-2, one containing a silicon wafer and a SiOC film is prepared as the substrate W, the same as in Experimental Example 1-1and the like. In Experimental Examples 4-1 and 4-2, however, Octadecyl-DS is prepared as a SAM material in order to form the protective film W5, unlike in Experimental Example 1-1 and the like.

In Experimental Example 4-1, formation of a protective film (process S2), oxygen plasma processing (process S1), and etching (process S3) are performed in this order. The octadecyl-DS is supplied in an undiluted state (having an Octadecyl-DS content of 100 vol %) by spin coating. Processing conditions for the process S1 and processing conditions for the process S3 are set to be the same as those in Experimental Example 1-2. As for a processing time of the etching, however, three cases of 1 minute, 2 minutes, and 3 minutes are prepared.

Figure 8:
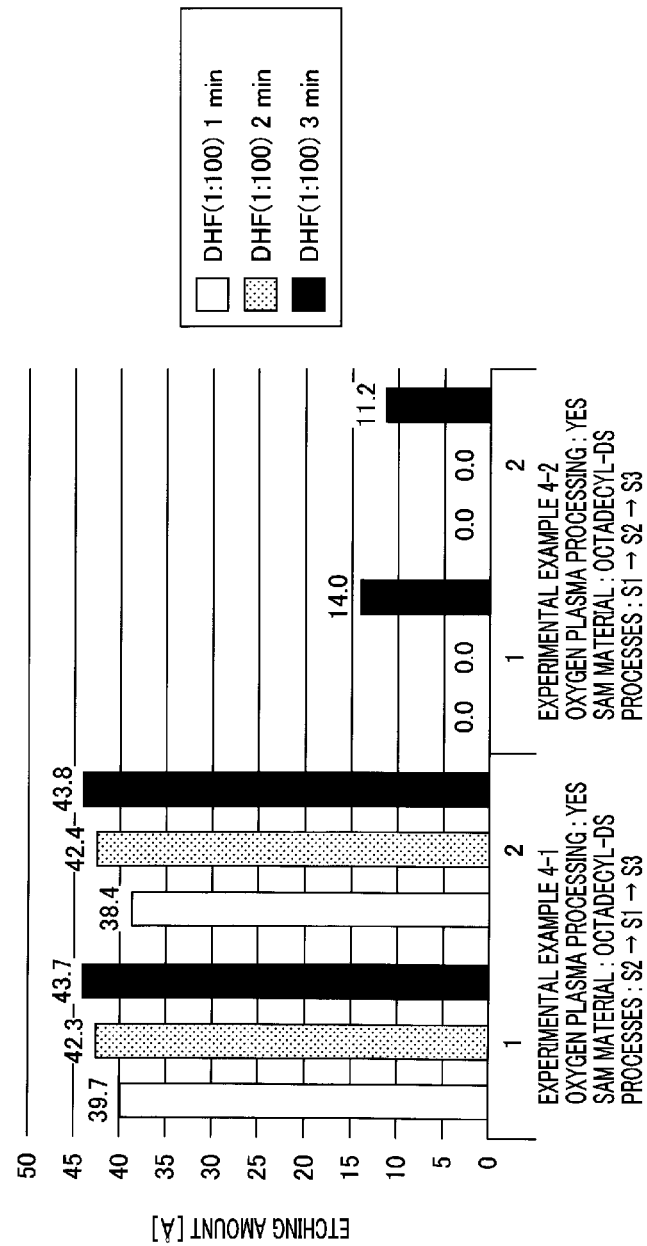
FIG. 8 is a diagram illustrating results of Experimental Examples 4-1 and 4-2.

As is apparent from the comparison of the result of Experimental Example 4-1 shown in FIG. 8 with the result of Experimental Example 1-2 shown in FIG. 5, even if the process S2 is performed before the process S1, the etching rate of the SiOC film in the process S3 cannot be slowed down. This is deemed to be because the protective film is decomposed by the oxygen plasma processing.

Meanwhile, in Experimental Example 4-2, the substrate is processed under the same processing conditions as in Experimental Example 4-1 except that the order of the supply of the SAM material (process S2) and the oxygen plasma processing (process S1) is reversed.

As can be clearly seen from the comparison of the result of Experimental Example 4-2 shown in FIG. 8 with the result of Experimental Example 4-1 also shown in FIG. 8, if the process S2 is performed after the process S1, the etching rate of the SiOC film in the process S3 can be slowed down. In particular, when the processing time of the etching is about 1 minute to 2 minutes, the SiOC film is hardly etched.

Although the above experimental examples have been described for the SiOC film, the same results will be obtained for a SiN film and a Low-k film other than the SiOC film. That is, the etching rate, which has been increased by the oxygen plasma processing, can be reduced by supplying the SAM material. As a result, the SiO film can be selectively etched.

Figure 9:
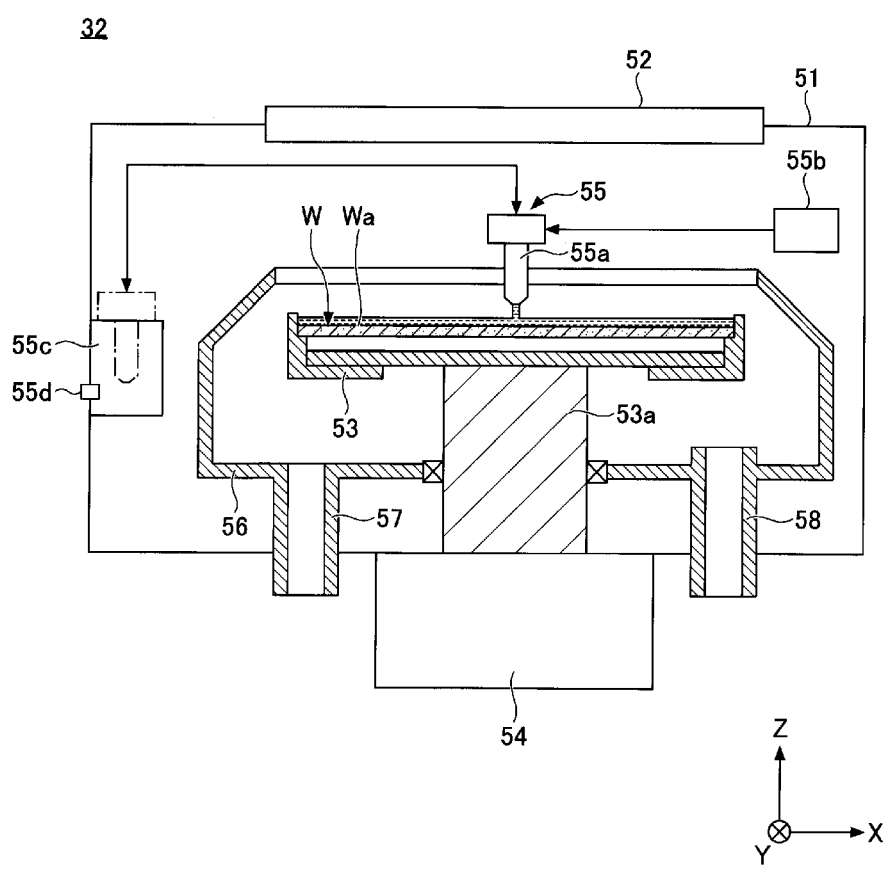
FIG. 9 is a cross sectional view illustrating an example of a protective film forming apparatus.

Now, referring to FIG. 9, an example of the protective film forming apparatus 32 will be explained. The protective film forming apparatus 32 is, for example, a spin coater. The protective film forming apparatus 32 includes, by way of example, a processing vessel 51, a gas supply mechanism 52, a chuck 53, a chuck driving mechanism 54, a liquid supply mechanism 55, and a recovery cup 56. The processing vessel 51 accommodates the substrate W therein. The gas supply mechanism 52 is configured to supply a gas into the processing vessel 51. The chuck 53 is configured to hold the substrate W within the processing vessel 51. The chuck driving mechanism 54 is configured to rotate the chuck 53. The liquid supply mechanism 55 is configured to supply a liquid to the substrate W held by the chuck 53. The recovery cup 56 is configured to collect the liquid shaken off from the substrate W being rotated.

The chuck 53 holds the substrate W horizontally so that the surface Wa of the substrate W on which the protective film W5 is to be formed faces upwards. The chuck 53 is shown to be a mechanical chuck in FIG. 9. Alternatively, however, it may be a vacuum chuck or an electrostatic chuck.

The chuck driving mechanism 54 rotates the chuck 53. A rotation shaft 53a of the chuck 53 is vertically disposed. The chuck 53 holds the substrate W so that a center of the substrate surface Wa coincides with a rotation center line of the chuck 53.

The liquid supply mechanism 55 has a nozzle 55a for discharging the liquid. The nozzle 55a is configured to discharge the liquid to the substrate W held by the chuck 53 from above the substrate W. The liquid is supplied to a radial center of substrate W being rotated, and is diffused in the entire radial direction of the substrate W by a centrifugal force, thus forming a liquid film. The number of the nozzle 55a may be one or more. A plurality of nozzles 55a may discharge multiple kinds of liquids, or one nozzle 55a may discharge the multiple kinds of liquids.

Although not shown, for each liquid, the liquid supply mechanism 55 has a supply flow path for supplying the liquid toward the nozzle 55a. Further, for each liquid, the liquid supply mechanism 55 has an opening/closing valve and a flow rate controller at portions of the supply flow path. The opening/closing valve opens or closes the supply flow path. The flow rate controller controls a flow rate.

In addition, the liquid supply mechanism 55 has a nozzle driving unit 55b configured to move the nozzle 55a. The nozzle driving unit 55b moves the nozzle 55a in a horizontal direction perpendicular to the rotation center line of the chuck 53. Further, the nozzle driving unit 55b may move the nozzle 55a in a vertical direction. Moreover, while the nozzle 55a is discharging the liquid to the substrate surface Wa, the nozzle driving unit may move the nozzle 55a in the radial direction of the substrate surface Wa.

The liquid supply mechanism 55 has a nozzle bath 55c for accommodating therein a discharge opening of the nozzle 55a. After discharging the liquid to the substrate surface Wa, the discharge opening of the nozzle 55a is accommodated in the nozzle bath 55c. When the plurality of nozzles 55a are provided, the nozzle bath 55c is provided for each of the nozzles 55a.

The liquid supply mechanism 55 has a gas supply 55d configured to supply dry air or an inert gas into the nozzle bath 55c. The gas supply 55d is provided in at least the nozzle bath 55c for the SAM material. The dry air or the inert gas purges water vapor remaining in the nozzle bath 55c. As a result, the SAM material can be suppressed from being solidified by the water vapor within the nozzle 55a. The inert gas is, for example, a $N_2$ gas. When the SAM material is Octadecyl-DS or Butyl-DS, it is desirable to provide the gas supply 55d. When the SAM material is TMSDMA, on the other hand, the gas supply 55d may not need to be provided.

The recovery cup 56 accommodates therein the substrate W held by the chuck 53, and collects the liquid shaken off from the substrate W being rotated. A drain pipe 57 and an exhaust pipe 58 are provided at the bottom of the recovery cup 56. The drain pipe 57 drains the liquid collected in the recovery cup 56. Further, the exhaust pipe 58 exhausts a gas in the recovery cup 56.

Figure 10:
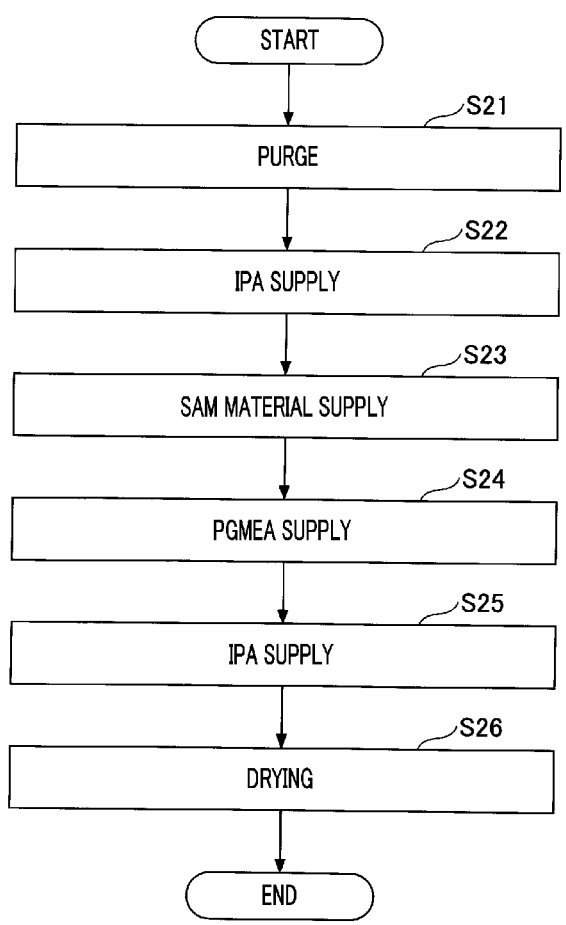
FIG. 10 is a flowchart illustrating an example of the process S2 of FIG. 2.

Now, referring to FIG. 10, an example of the process S2 of FIG. 2 in the protective film forming apparatus 32 will be described. As shown in FIG. 10, the process S2 includes, for example, processes S21 to S26. The processes S21 to S26 are performed under the control of the control device 9. A processing shown in FIG. 10 is started when the transfer device 38 of the processing station 3 carries the substrate W into the protective film forming apparatus 32 and the chuck 53 holds the substrate W. Here, the process S2 needs to include the process S23 at least.

First, the gas supply mechanism 52 supplies the dry gas or the inert gas into the processing vessel 51 to purge the water vapor remaining within the processing vessel 51 (process S21). The inert gas is, for example, an $N_2$ gas. By purging the water vapor before supplying the SAM material, the solidification of the SAM material by the water vapor can be suppressed. When the SAM material is Octadecyl-DS, it is desirable to carry out the process S21. Meanwhile, when the SAM material is TMSDMA or Butyl-DS, the process S21 may not be performed.

Next, the liquid supply mechanism 55 supplies an organic solvent such as IPA to the substrate surface Wa (process S22). By supplying the organic solvent before supplying the SAM material, adhesion between the SAM material and the substrate surface Wa can be improved. The organic solvent used in the process S22 includes IPA, acetone, dibutyl ether, cyclohexane, ethyl acetate, butyl acetate, propyl acetate, or PGMEA (propylene glycol monomethyl ether acetate).

Thereafter, the liquid supply mechanism 55 supplies a liquid containing the SAM material to the substrate surface Wa (process S23). The SAM material is supplied as a solution by being dissolved in a solvent. By diluting the SAM material with the solvent, the consumption amount of the SAM material can be reduced. A concentration of the SAM material in the solution is, for example, 1 vol % to 20 vol %. The protective film W5, which is SAM, is formed on the surface of the SiN film W1. The protective film W5 is also formed on the surface of the SiO film W2.

Next, the liquid supply mechanism 55 supplies an organic solvent such as PGMEA to the substrate surface Wa (process S24). As a result, a surplus of the SAM material, that is not chemically adsorbed to the substrate surface Wa, can be removed. In the process S24, one that does not contain an OH group is used as the organic solvent. This is because an organic solvent containing an OH group such as IPA reacts with the SAM material which is not chemically adsorbed to the substrate surface Wa. It is also assumed that particles may be generated by this reaction. If the organic solvent containing no OH group is used, generation of the particles can also be suppressed. As an example of the organic solvent containing no OH group, ketones, esters, or ethers may be used. The organic solvent containing no OH group may be, by way of non-limiting example, acetone, dibutyl ether, cyclohexane, ethyl acetate, butyl acetate, propyl acetate, or PGMEA.

Next, the liquid supply mechanism 55 supplies an organic solvent such as IPA to the substrate surface Wa (process S25). The organic solvent used in the process S25 has higher volatility than the organic solvent used in the process S24. The lower a boiling point is, the higher volatility will be. By using the organic solvent having the high volatility, drying of the substrate W can be accelerated.

Then, the chuck driving mechanism 54 rotates the substrate W together with the chuck 53 to remove the liquid such as the organic solvent from the substrate W by a centrifugal force, thus drying the substrate W (process S26). In the process S26, the liquid supply mechanism 55 may move the nozzle 55a outwards in the radial direction of the substrate surface Wa while discharging the organic solvent from the nozzle 55a. A region of the substrate surface Wa exposed from the organic solvent gradually spreads from the center to the periphery of the substrate surface Wa.

Furthermore, although the protective film forming apparatus 32 is used for the drying (process S26) of the substrate W in the present exemplary embodiment, an apparatus other than the protective film forming apparatus 32, for example, a supercritical drying apparatus may be used instead. In this case, the substrate W is transferred to the supercritical drying apparatus in the state that a liquid film of an organic solvent is loaded on the substrate surface Wa. Then, the supercritical drying apparatus dries the substrate W by replacing the liquid film of the organic solvent covering the substrate surface Wa with a supercritical fluid.

In addition, the protective film forming apparatus 32 of the present exemplary embodiment, which is the spin coater, is of a single wafer type. However, it may be of a batch type. The batch type protective film forming apparatus 32 has a processing tub or the like storing a liquid therein, and processes a multiple number of substrates at the same time by immersing the substrates in the liquid.

So far, the substrate processing method and the substrate processing apparatus according to the present disclosure have been described. However, the present disclosure is not limited to the above-described exemplary embodiment or the like. Various changes, corrections, replacements, addition, deletion and combinations may be made within the scope of the claims, and all of these are included in the scope of the inventive concept of the present disclosure.

This application claims priority to Japanese Patent Application No. 2020-175438, field on Oct. 19, 2020, which application is hereby incorporated by reference in their entirety.

According to the exemplary embodiments, it is possible to selectively etch the SiO film by slowing down the etching rate of the Low-k film or SiN film exposed to the oxygen plasma.

We claim:

1. A substrate processing method, comprising:
preparing a substrate having a surface in which a SiO film and a Low-k film or a SiN film are exposed, the Low-k film or the SiN film being exposed to oxygen plasma;
forming a protective film on the Low-k film or the SiN film by supplying an organic compound (self-assembled monolayer (SAM) material) configured to form a SAM to the surface of the substrate; and
etching the SiO film by supplying hydrofluoric acid to the surface of the substrate, while inhibiting etching of the Low-k film or the SiN film caused by the hydrofluoric acid with the protective film.

2. The substrate processing method of claim 1,
wherein the forming of the protective film comprises supplying a liquid containing the SAM material to the surface of the substrate.

3. The substrate processing method of claim 2,
wherein the forming of the protective film comprises supplying the liquid containing the SAM material and a first organic solvent to the surface of the substrate in this order.

4. The substrate processing method of claim 3,
wherein the forming of the protective film comprises supplying a second organic solvent different from the first organic solvent to the surface of the substrate after supplying the liquid containing the SAM material and before supplying the first organic solvent,
the first organic solvent has higher volatility than the second organic solvent, and
the second organic solvent does not contain an OH group.

5. The substrate processing method of claim 4,
wherein the second organic solvent includes acetone, dibutyl ether, cyclohexane, ethyl acetate, butyl acetate, propyl acetate, or PGMEA (propylene glycol monomethyl ether acetate).

6. The substrate processing method of claim 2,
wherein the forming of the protective film comprises supplying an organic solvent to the surface of the substrate before supplying the liquid containing the SAM material.

7. The substrate processing method of claim 6,
wherein the organic solvent supplied to the surface of the substrate prior to the liquid containing the SAM material includes IPA, acetone, dibutyl ether, cyclohexane, ethyl acetate, butyl acetate, propyl acetate, or PGMEA (propylene glycol monomethyl ether acetate).

8. The substrate processing method of claim 2, further comprising:
accommodating, in a nozzle bath, a discharge opening of a nozzle configured to discharge the liquid containing the SAM material; and
supplying dry air or an inert gas into the nozzle bath.

9. The substrate processing method of claim 2,
wherein the forming of the protective film comprises supplying dry air or an inert gas into a processing vessel accommodating the substrate therein.

10. The substrate processing method of claim 2,
wherein the forming of the protective film and the etching of the SiO film are repeated a preset number of times.

11. The substrate processing method of claim 2,
wherein the SAM material includes (trimethylsilyl)dimethyl amine, butyl dimethyl silane, octadecyl dimethyl silane, triethyl silane, or octadecyl diisobutyl silane.

12. The substrate processing method of claim 2,
wherein the Low-k film includes a SiOC film, a SiOCH film, a hydrogen silsesquioxane (HSQ) film, a methyl silsesquioxane (MSQ) film, or a polyaryl ether (PAE) film.

13. The substrate processing method of claim 1,
wherein the forming of the protective film and the etching of the SiO film are repeated a preset number of times.

14. The substrate processing method of claim 1,
wherein the SAM material includes (trimethylsilyl)dimethyl amine, butyl dimethyl silane, octadecyl dimethyl silane, triethyl silane, or octadecyl diisobutyl silane.

15. The substrate processing method of claim 1,
wherein the Low-k film includes a SiOC film, a SiOCH film, a hydrogen silsesquioxane (HSQ) film, a methyl silsesquioxane (MSQ) film, or a polyaryl ether (PAE) film.

16. A substrate processing apparatus, comprising:
a control device configured to control a protective film forming apparatus, an etching apparatus and a transfer device to perform a substrate processing method as claimed in claim 1;
the protective film forming apparatus configured to form the protective film on the Low-k film or the SiN film by supplying the SAM material to the surface of the substrate;
the etching apparatus configured to etch the SiO film by supplying the hydrofluoric acid to the surface of the substrate, while inhibiting etching of the Low-k film or the SiN film caused by the hydrofluoric acid with the protective film; and
the transfer device configured to transfer the substrate between the protective film forming apparatus and the etching apparatus.

17. A substrate processing apparatus, comprising:
a control device configured to control a liquid processing apparatus to perform a substrate processing method as claimed in claim 1; and
the liquid processing apparatus configured to supply a liquid containing the SAM material and a liquid containing the hydrofluoric acid to the surface of the substrate.

* * * * *